March 7, 1967 F. G. MORITZ 3,308,307

SERVO AMPLIFIER UTILIZING COMPOSITE WAVEFORM OF SAWTOOTH WITH HIGH FREQUENCY SIGNAL IMPOSED THEREON

Filed Aug. 14, 1963 2 Sheets-Sheet 1

March 7, 1967 F. G. MORITZ 3,308,307

SERVO AMPLIFIER UTILIZING COMPOSITE WAVEFORM OF SAWTOOTH WITH HIGH FREQUENCY SIGNAL IMPOSED THEREON

Filed Aug. 14, 1963 2 Sheets-Sheet 2

United States Patent Office 3,308,307
Patented Mar. 7, 1967

3,308,307
SERVO AMPLIFIER UTILIZING COMPOSITE WAVEFORM OF SAWTOOTH WITH HIGH FREQUENCY SIGNAL IMPOSED THEREON

Frederick G. Moritz, 20 Aberdeen Road, Hauppauge, N.Y. 11787

Filed Aug. 14, 1963, Ser. No. 302,174
14 Claims. (Cl. 307—88.5)

This invention relates to a servo amplifier and, more specifically, to a servo amplifier used to control the firing of gated rectifiers in response to an input error signal in which the amplitude of the input error signal is proportional to the error and in which the polarity of the input error signal is indicative of the direction of the error.

Servo amplifiers to provide an output signal the effective direction, such as phase or polarity, of which is responsive to the polarity of the input signal and the effective amplitude of which is responsive to the amplitude of the input signal are known in several forms.

For example, D.C. amplifiers have been used. However, such amplifiers suffer from problems of drift and stability.

Control of the conduction angles of gated rectifiers, particularly the gated silicon controlled rectifiers employed in recent years, has been accomplished by A.C. magnetic servo amplifiers. However, magnetic servo amplifiers used to control conduction angles suffers from the drawback that control is delayed by a half cycle of the line frequency.

It is, therefore, the primary object of the present invention to provide a stable, fast acting servo amplifier which will provide output signals suitable for the control of the conduction angle of alternate gated rectifiers in response to an input error signal of variable amplitude and reversible polarity.

In accordance with this object, there is provided, in a preferred embodiment of this invention, a servo amplifier having an input terminal and having first and second output terminal which may be coupled to the gate electrode of gated rectifiers for control of the firing thereof. The first or second output terminal is energized in response to the polarity of the input signal and the time of energizing each output terminal with a gate firing pulse is dependent upon the amplitude of the input signal thereby to control the conduction angle of the gate controlled rectifiers.

The servo amplifier comprises an astable multi-vibrator free running at a high frequency with respect to the line frequency and a modulator such as a ring modulator. The input signal is applied to the ring modulator and modulated by the multi-vibrator square wave. The modulated output of the ring modulator will, therefore, comprise a square wave, the amplitude of which is directly related to the amplitude of the input wave and the phase of which is directly related to the polarity of the input signal.

The modulated signal from the ring modulator is amplified and applied simultaneously to a first and second AND gate. The other input to the first AND gate is derived from the first stage of the astable multi-vibrator. The other input to the second AND gate is derived from the second stage of the multi-vibrator. Since the modulated input signal is keyed or phased-locked to the multivibrator outputs, the modulated signal will be in phase with the signal from one stage of the multi-vibrator and 180° out of phase with the other. The inphase relationship will change as the polarity of the input reverses. The AND gate will pass a square wave of the modulated input signal (being the smaller of the two signals applied to the AND gate).

A wave-shape generator as, for example, a sawtooth generator is provided to generate a wave shape of increasing amplitude with time throughout each half cycle of the line frequency. The sawtooth from the generator is applied to the base electrodes of the first transistor of both a first and second Schmitt trigger (also termed a squaring circuit, or a bistable multi-vibrator having regenerative feedback for faster switching). Simultaneously, the output of the first AND gate is applied to the base of the first Schmitt trigger and the output of the second AND gate is applied to the base of the second Schmitt trigger. Since only one gate will pass a signal, the input to one trigger will comprise the sawtooth alone. The other trigger input will comprise a composite of the sawtooth and the modulated input signal passed by the AND gate. The sawtooth waveform is controlled so that it will not reach the threshold voltage to trigger the Schmitt circuit. However, the composite waveform of the sawtooth and the modulated input will reach the triggering voltage of the Schmitt trigger. Since the sawtooth is constant, the phase delay to reach the threshold or triggering potential by the composite wave will depend on the amplitude of the modulated signal. When the combined amplitude of the composite signal reaches the triggering potential of the Schmitt trigger, it will fire. The output of the Schmitt trigger will, therefore, consist of a plurality of square waves of fixed amplitude, the initiation time of which is determined by the time taken to reach the triggering potential. Emitter followers are used to couple the outputs of the first and second Schmitt trigger circuits to the gate electrodes of the first and second gated rectifiers respectively. Thus, when the Schmitt trigger circuit operates, the gated rectifier will be driven into the conductive state, and, of course, will conduct throughout the remainder of the half cycle. Removal of the gate electrode potential and the reduction of the anode potential to zero will return conduction control to the gate electrode. The gated rectifiers are serially coupled with the forward and reverse servo motor windings to control direction of and torque of motor drive in conventional manner.

The dead band of the circuit may be adjusted by coupling the emitter electrodes of the first transistor of said first and second trigger circuits to a source of potential of variable amplitude. In this manner, the dead band may be simply and easily adjusted. Also, gain variation as a function of the amplitude of the input signal is often desirable, which is provided in the present circuit merely by selection of the wave shape provided by the wave from generator. Such control of gain characteristics as a function of the input signal amplitude is simply achieved in the present circuit although it is very difficult to achieve in many of the circuits known to the prior art.

Having briefly described this invention, it will be described in greater detail along with other objects and advantages thereof in the following detailed description, which may best be understood by reference to the accompanying drawings, of which:

Figure 1:
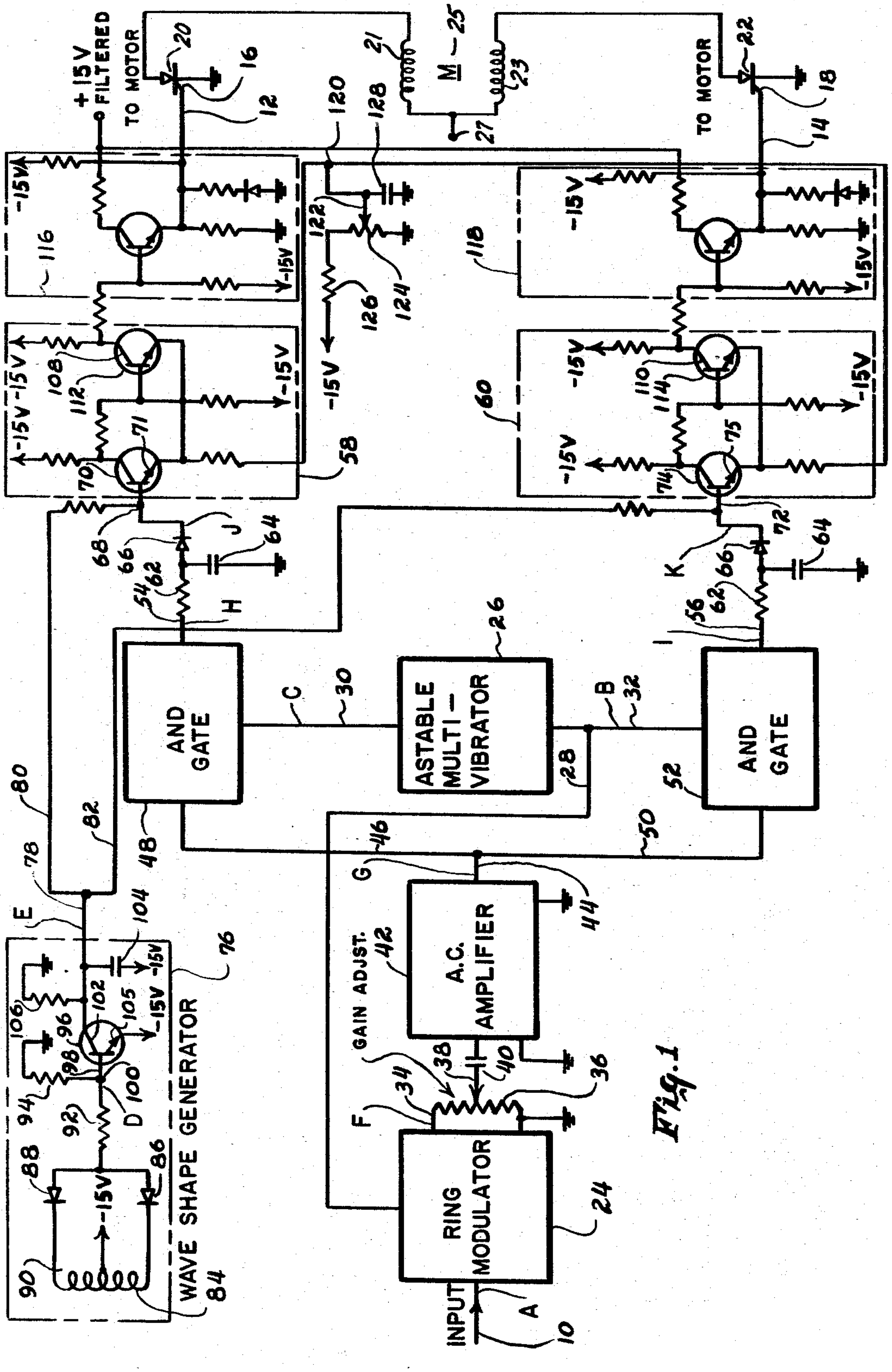
FIG. 1 is a schematic diagram of a servo amplifier in accordance with the present invention.

In FIG. 1, there is shown a servo amplifier having an input lead 10 and a first and second output lead 12 and 14 respectively, which outputs are coupled to the gate electrodes 16 and 18 of a first and second gated rectifier 20 and 22 respectively. The gated rectifiers (which preferably are SCR's or Silicon controlled rectifiers) may be respectively serially coupled with a forward motor winding 21 and reverse motor winding 23 of a motor 25 and a source of full wave rectified alternating voltage applied at terminal 27 in conventional fashion. Thus, as the respective rectifiers fire, the current will flow through the respective controlled winding to drive the servo motor in the desired direction. The current flow through the motor winding and thus the accelerating motor torque developed will be determined by the time of firing of the gated rectifier with respect to the half cycle of current applied therethrough.

The input signal is applied to a ring modulator 24 which modulates the input signal by the signal applied thereto from the astable multi-vibrator 26 over lead 28.

The astable multi-vibrator is conventional in construction and comprises a free-running multi-vibrator operating at a frequency much higher than the line frequency. For example, multi-vibrator operation to generate a square wave output with a frequency of approximately 3 kc. is satisfactory. The output from the multi-vibrator on leads 30 and 32 will be 180° out of phase as will be seen by inspection of the wave forms in FIG. 2 illustrating the wave shapes at B and C respectively.

Figures 2, 3, 4, 5, 6:
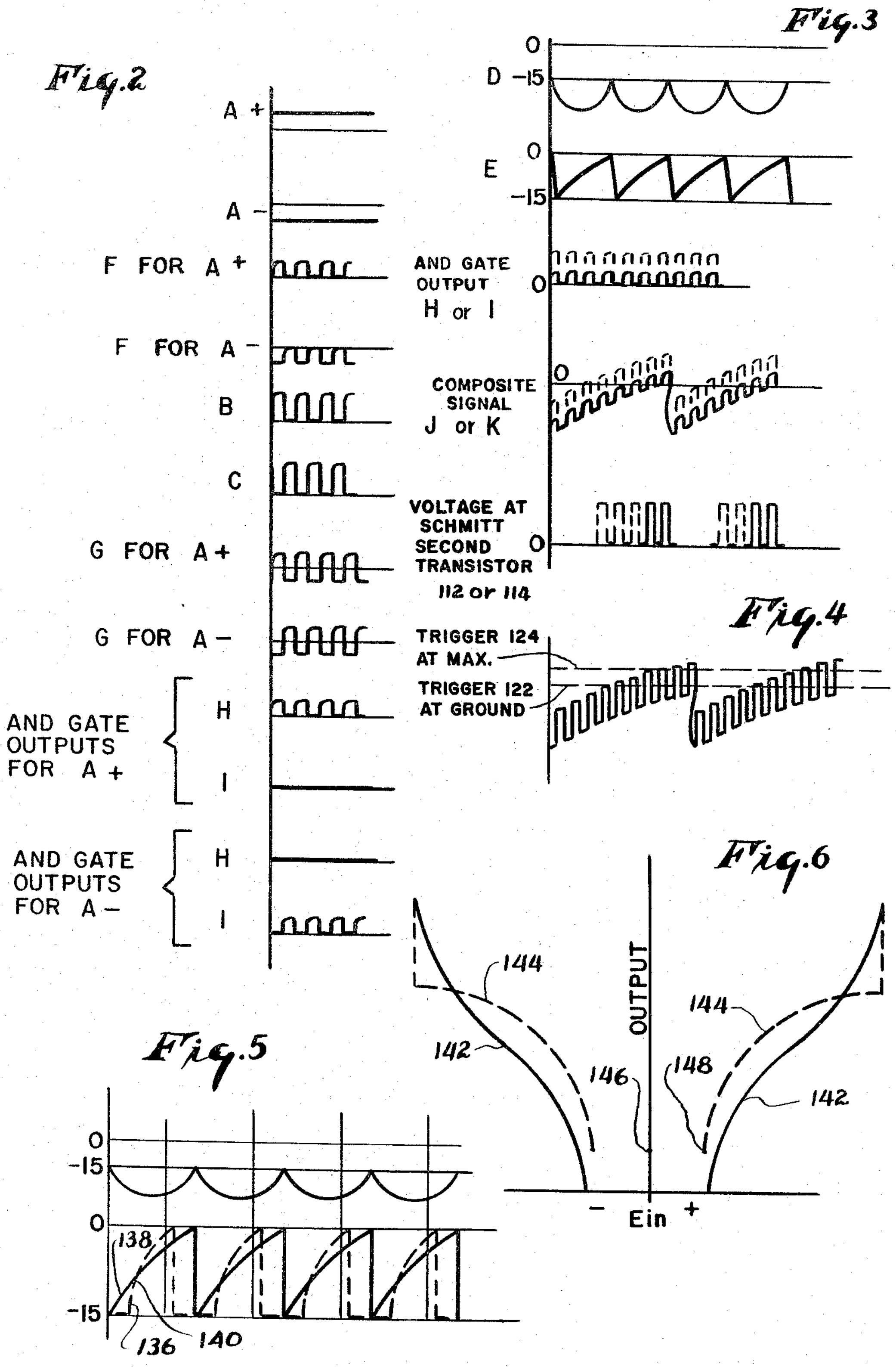
FIG. 2 is a plot of the amplitude of the signals appearing in various portions of the circuitry shown in FIG. 1 along a common time scale.
FIG. 3 is a plot of the wave form of the individual wave form generated in the circuit of FIG. 1 and the composite signal as the waveforms are added, taken at the indicated points of the circuit shown in FIG. 1.
FIG. 4 is a plot of the composite signal applied to one of the trigger circuits used in FIG. 1, illustrating the variation in the dead-band of the circuit.
FIG. 5 is a plot of the wave shape generator for different modes of operation to illustrate the change of the response with input signal amplitude.
FIG. 6 is a plot of the response of the overall amplifier by plotting conduction angles as a function of input signal amplitude.

The ring modulator will modulate the input signal (A FIG. 2) by the square wave signal applied thereto to generate an output signal, the amplitude of which is equal to the amplitude of the input signal and the phase of which is related to the polarity of the input signal as is shown at F in FIG. 2 for both polarity states of the input signal. The output from the modulator 24 is applied over lead 34 to a potentiometer 36, the tap 38 of which couples the desired proportion of the signal through coupling capacitor 40 to an A.C. amplifier 42.

The coupling capacitor 40 serves to eliminate the D.C. component in the wave form shown at F. Thus, after amplification by a conventional A.C. amplifier 42, the output wave form at G on lead 44 consists of a square wave signal having an amplitude relating to the input signal and a phase relationship related to the polarity of the input signal as is shown for both polarity states of the input as G FIG. 2. This output signal is applied over lead 44 and 46 to a first AND gate 48 and over leads 44 and 50 to a second AND gate 52. The AND gates also receive an input signal from the respective stages of the astable multi-vibrator which are of equal amplitude but opposite in phase. The AND gates will pass a signal only when the input signals applied thereto are coincident at phase. Similarly, when the input signals are noncoincident, the AND gate will not pass an output signal. Since the modulated input signal applied to the gates are keyed on phase-locked to the multi-vibrator, the modulated input signal will always be in phase with one stage of the multi-vibrator input and 180° out of phase with the other stage of the multi-vibrator. Thus, AND gate 48 will pass a signal with one polarity of the input signal and the AND gate 52 will pass a signal with the opposite polarity of the input signal. Thus, as is shown as waveform H and I in FIG. 2, the AND gate 48 will pass a signal when the input polarity is positive and gate 52 will pass no signal. Similarly, if the input polarity is negative, also illustrated in FIG. 2, the AND gate 52 will generate an output signal illustrated at I and gate 48 will pass no signal.

Thus, the circuit distinguishes between the polarity of input signals and provides an output signal on either lead 54 or lead 56 depending upon input polarity, which signal has amplitude directly proportional to the amplitude of the input signal. The relationship between the amplitude of the signals on leads 54 and 56 to the amplitude of the input signal can be controlled by the tap position 38 on the potentiometer which is a conventional way of adjusting amplifier gain.

In order to utilize the signal amplitude for control of the time of firing of the SCR, a first and second Schmitt trigger circuit 58 and 60 (also referred to as a squaring circuit or a squaring bistable multi-vibrator) is provided. The signal from lead 54 is coupled through a low-pass filter network comprising a resistor 62, capacitor 64 and diode 66 to the base electrode 68 of the input transistor 70 of the Schmitt trigger 58. Similarly, the signal on lead 56 is coupled through an identical low-pass filter to the base electrode 72 of the first transistor 74 of the Schmitt trigger 60. A wave form generator 76 is provided and the output signal therefrom is coupled through leads 78 and 80 to base 68 of transistor 70 and through leads 78 and 82 to the base 72 of transistor 74. The wave shape generator 76 is preferably the sawtooth oscillator schematically illustrated.

The center tap 12 volt A.C.–60 cycle winding 84 and diodes 86 and 88 form a full wave rectifier referenced to the −15 volts, to which the transformer center tap 90 is connected. This supply voltage together with the divider circuit formed by resistors 92 and 94 determine the point at which transistor 96 will fire since the base electrode 98 thereof is coupled to the junction 100 between resistors 92 and 94. Thus, as can be seen by reference to the wave form at point D shown in FIG. 2, it can be seen that once during each half cycle, the voltage at the junction will rise to zero enabling transistor 96 to conduct. When the transistor conducts, the collector electrode 102 will go to −15 volts, as determined by the supply coupled to the emitter electrode 105. During such conduction, any charge in capacitor 104 is drained off. When the transistor again is turned off, capacitor 104 starts to charge through resistor 106. Thus, the wave form, at point E illustrated in FIG. 2 is a sawtooth wave form, the slope of which is determined by the time constant of the circuit containing capacitor 104 and resistor 106.

Since the output of the generator 76 is coupled to the input of the Schmitt triggers and since the amplified and modulated input voltage is also applied to the same electrode, the operation of the Schmitt trigger will be determined by the composite wave form. This is best seen by reference to FIG. 3 which shows the sawtooth wave form, the square wave, the composite wave applied to the input transistor of the Schmitt trigger and the output second stage output derived at the collector electrodes 108 and 110 of the respective second transistors 112 and 114 of the trigger circuits.

As can be seen, the composite signal is a stepping signal having a plurality of square wave pulses superimposed on the rising sawtooth wave form. When this composite signal reaches the firing potential or "threshold voltage" of the Schmitt trigger, it will fire the circuit generating an output signal illustrated in FIG. 3 of predetermined amplitude. However, the time to reach the threshold with respect to a half cycle of the line frequency is determined both by the time during which the sawtooth voltage has been allowed to increase and by the amplitude of the superimposed square wave thereon. Thus phase control by input signal amplitude is provided. The output signal of the trigger circuit 58 is coupled to the gate electrode 12 of the controlled rectifier 20 by an emitter follower 116. Similarly, the output of the trigger 60 is coupled to the gate electrode 14 of the controlled rectifier 22 by an emitter follower 118. The output of the trigger circuits comprise a plurality of pulses. The first pulse turns the associated SCR on and the subsequent pulses have no effect since the gate loses control for the remainder of the cycle. However, the pulses do not harm and are not eliminated.

In order to ensure stability of servo circuits, it is necessary to provide means for adjusting the dead band of the amplifier, which is provided in the present amplifier by coupling the emitter electrodes 71 and 75 of transistor 70 and 74 respectively to a source of variable potential at terminal 120. The potential at terminal 120 is selected by the position of tap 122 of potentiometer 124 which potentiometer is serially coupled with resistor 126 between ground and −15 volt supply. A bypass capacitor 128 is coupled across the potentiometer 124. The operation of the adjustment of the bypass may best be understood by reference to FIG. 4 which shows the composite wave form 130 plotted with the triggering levels when the resistor 124 is at its maximum as shown by line 132 and when the tap 122 is at ground potential as represented by line 134. Thus, it can be seen that the triggering level of both trigger circuits 58 and 60 can be simultaneously and simply adjusted thereby to control the dead band of the circuit.

Similarly, it is oftentimes desirable to provide an amplifier gain which varies with the amplitude of the input signal. In such applications, the wave form from the generator 76 may be modified merely by adjustment of the resistance values of resistors 92 and 94 to provide drive transistor 96 into a conductive state over a longer portion of the total cycle. In such case, as is illustrated in FIG. 5, the wave form provided will follow the outline represented by the curve 136 as contrasted with the regular linear sawtooth of curve 138. When the wave form 136 is applied to the trigger circuit in combination with the square wave superimposed thereon, the modified sawtooth 136 will provide an immediate jump to a finite output as the input is increased above zero and then will have an increasing output as a function of input until point 140 is reached along the wave form. Thereafter, the modified sawtooth will produce a lower gain of output as a function of increase in input than would the linear sawtooth. This characteristic of the gain of the amplifier is shown in FIG. 6 which is a plot of the output in terms of conduction angle of the controlled SCR as a function of input. Curve 142 is the gain characteristic of the amplifier utilizing a linear sawtooth and the curve 144 is a plot using the modified sawtooth. It will be noted that other wave forms can be utilized to give desired response characteristics. It is also important to note that when using the modified sawtooth wave form, an output signal would be provided with zero input due to the noise in the circuit. Thus, the curve for the modified output would start at point 146. This would obviously lead to servo circuit instability, but can be overcome by adjustment of the dead band by the positioning of tap 122 on the potentiometer 124, which would move the starting point of curve 144 to point 148.

Thus, in this manner, the response characteristics can be had in a stable circuit configuration.

This invention may be variously modified and embodied within the scope of the subjoined claims.

What is claimed is:

1. A servo amplifier to control firing of the first and second gated rectifiers respectively in response to the polarity of the direct voltage input signal and to control the conduction angle of each gated rectifier relative to the line frequency applied to said gated rectifiers in response to the amplitude of the input signal, comprising generating means to generate a square wave at a frequency high in comparison with said line frequency; modulating means to modulate the input signal by the square wave generated by said multi-vibrator to provide an output signal, the amplitude of which is determined by the amplitude of the input signal, and the phase of which is determined by the polarity of the input signal; a first and second AND gate; amplifying means to apply said modulated input signal simultaneously to said first and second AND gates; means to enable said first and second gates on alternate half cycles of said square wave; a first and second trigger circuit; means for applying the output signal of said first AND gate to said first trigger circuit and the output of said second AND gate to said second trigger circuit; a wave form generator producing an output waveform at said line frequency; means for applying the output of said waveform generator simultaneously to the input of said first and second trigger circuit; means coupling the output of said first trigger circuit to the gate electrode of said first gated rectifier; and means coupling the output of said second trigger circuit to the gate electrode of said second gated rectifier.

2. An amplifier in accordance with claim 1 wherein each of said trigger circuits includes a first transistor and wherein there is provided means for adjusting the base to collector bias of the first transistor of each of said trigger circuits thereby to adjust the dead band of said amplifier.

3. An amplifier in accordance with claim 1 in which the wave shape generated by said wave form generator comprises a sawtooth.

4. An amplifier in accordance with claim 3 in which said sawtooth is a regular sawtooth over a full half cycle of said line frequency.

5. An amplifier in accordance with claim 3 in which said sawtooth is a sawtooth extending over only a portion of a half cycle of said line frequency.

6. A circuit for controlling the firing of a gated electronic valve of the type which fires and becomes fully conductive upon receiving a gating signal comprising: means to produce a composite waveform having generally a sawtooth shape of a first constant frequency with pulses at a second higher frequency modulating the amplitude of the sawtooth wave shape, means to vary the amplitude of said pulses in accordance with an applied input signal and bistable circuit means connected to receive said composite waveform and operable to apply a gating signal to said gated electronic valve when said composite waveform reaches a predetermined amplitude.

7. A circuit as recited in claim 6 wherein said bistable circuit means comprises a Schmitt trigger.

8. A circuit as recited in claim 6 wherein said gated electronic valve comprises a silicon control rectifier.

9. A circuit for controlling the firing of a gated electronic valve of the type which fires and becomes fully conductive upon receiving a gating signal comprising: means to produce a first waveform of a first constant frequency, means to produce a second waveform of a frequency which is several times said first frequency and having an amplitude corresponding to the amplitude of an applied input signal, means responsive to said first and second waveforms to produce a composite of said first and second waveforms corresponding to the sum of said first and second waveforms, and means responsive to said composite waveform reaching a predetermined amplitude to apply a gating signal to said electronic valve.

10. A circuit as recited in claim 9 wherein said first waveform comprises a sawtooth waveform.

11. A circuit for controlling the firing of first and second gated electronic valves of the type which fire and become fully conductive upon receiving a gating signal comprising: a waveform generator for producing a waveform of a first frequency, means for producing pulses of a second frequency several times said first frequency having an amplitude corresponding to an applied input signal and having a first phase in response to said input signal being of a first polarity and a second phase in response to said input signal being of a second polarity, a first gate connected to receive said pulses, a second gate connected to receive said pulses, means to enable said first gate in synchronism with said first phase and to enable said second gate in synchronism with said second phase so that said first gate passes pulses only in said first phase and said second gate passes pulses only in said second phase, first circuit means to combine the pulses passing through said first gate and said waveform produced by said waveform generator into a composite waveform, second circuit means to combine the pulses passing through said second gate and the waveform generated by said waveform generator into a second composite waveform, first trigger means to apply a gating signal to one of said gated electronic valves in response to the composite waveform produced by said first circuit means reaching a predetermined amplitude, and second trigger means to apply a gating signal to said second gated electronic valve in response to the composite waveform produced by said second circuit means reaching a predetermined value.

12. A circuit as recited in claim 11 wherein the waveform generated by said waveform generator is a sawtooth waveform.

13. A circuit as recited in claim 11 wherein said first and second trigger means comprise Schmitt triggers.

14. A circuit as recited in claim 11 wherein said gated electronic valves comprise silicon controlled rectifiers.

References Cited by the Examiner

UNITED STATES PATENTS

| | | | |
|---|---|---|---|
| 2,495,726 | 1/1950 | Houghton et al. | 328—39 |
| 3,105,179 | 9/1963 | Young et al. | 307—88.54 |
| 3,192,462 | 6/1965 | James | 307—88.5 |
| 3,213,376 | 10/1965 | Riordan et al. | 328—127 |

ARTHUR GAUSS, *Primary Examiner.*

B. P. DAVIS, *Assistant Examiner.*